(12) United States Patent
Shepard et al.

(10) Patent No.: US 9,299,488 B2
(45) Date of Patent: Mar. 29, 2016

(54) MAGNETIC DEVICES WITH INTEGRAL COOLING CHANNELS

(71) Applicant: Hamilton Sundstrand Corporation, Charlotte, NC (US)

(72) Inventors: Charles Shepard, DelKalb, IL (US); Eric Karlen, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 14/183,700

(22) Filed: Feb. 19, 2014

(65) Prior Publication Data

US 2015/0097644 A1  Apr. 9, 2015

Related U.S. Application Data

(60) Provisional application No. 61/887,052, filed on Oct. 4, 2013.

(51) Int. Cl.
| H01F 27/06 | (2006.01) |
| H01F 27/08 | (2006.01) |
| H01F 27/28 | (2006.01) |
| H01F 27/32 | (2006.01) |
| H01F 41/02 | (2006.01) |

(52) U.S. Cl.
CPC ............. *H01F 27/08* (2013.01); *H01F 27/06* (2013.01); *H01F 27/2876* (2013.01); *H01F 27/322* (2013.01); *H01F 41/02* (2013.01); *Y10T 29/49073* (2015.01)

(58) Field of Classification Search
CPC ............................................. H01F 27/00–27/30
USPC ....................................................... 336/55–62
See application file for complete search history.

(56) References Cited

U.S. PATENT DOCUMENTS

| 4,541,171 | A | 9/1985 | Buckley |
| 7,647,692 | B2 * | 1/2010 | Lanoue et al. ................. 29/609 |
| 7,973,628 | B1 | 7/2011 | MacLennan |
| 8,009,004 | B2 | 8/2011 | Ahangar et al. |
| 8,816,808 | B2 * | 8/2014 | MacLennan et al. ........... 336/58 |
| 2009/0322460 | A1 * | 12/2009 | Lin ........................ H01F 27/16 336/62 |

FOREIGN PATENT DOCUMENTS

| DE | 2032507 A1 | 1/1972 |
| JP | H0737724 A | 2/1995 |

(Continued)

OTHER PUBLICATIONS

Search Report and Opinion issued by the European Patent Office on Feb. 17, 2015 for European Patent Application No. 14187525.

(Continued)

*Primary Examiner* — Tuyen Nguyen
(74) *Attorney, Agent, or Firm* — Locke Lord LLP; Scott D. Wofsy; Christopher J. Cillié

(57) ABSTRACT

A magnetic device includes an electrically insulating body and a conductor coil. The insulating body defines an internal cavity for a magnetic device core and a coolant channel routed about the internal cavity. The conductor coil extends through the insulating body and winds about the internal cavity. The electrically insulating body electrically insulates the internal cavity and coolant channel from the conductor coil.

14 Claims, 4 Drawing Sheets

(56) References Cited

FOREIGN PATENT DOCUMENTS

| | | | |
|---|---|---|---|
| JP | 2009188033 A | 8/2009 | |
| JP | 2011181856 A | 9/2011 | |
| WO | WO-2012040563 A2 | 3/2012 | |

OTHER PUBLICATIONS

Extended European Search Report for Patent Application No. 15175715.0-1556 dated Dec. 21, 2015.

\* cited by examiner

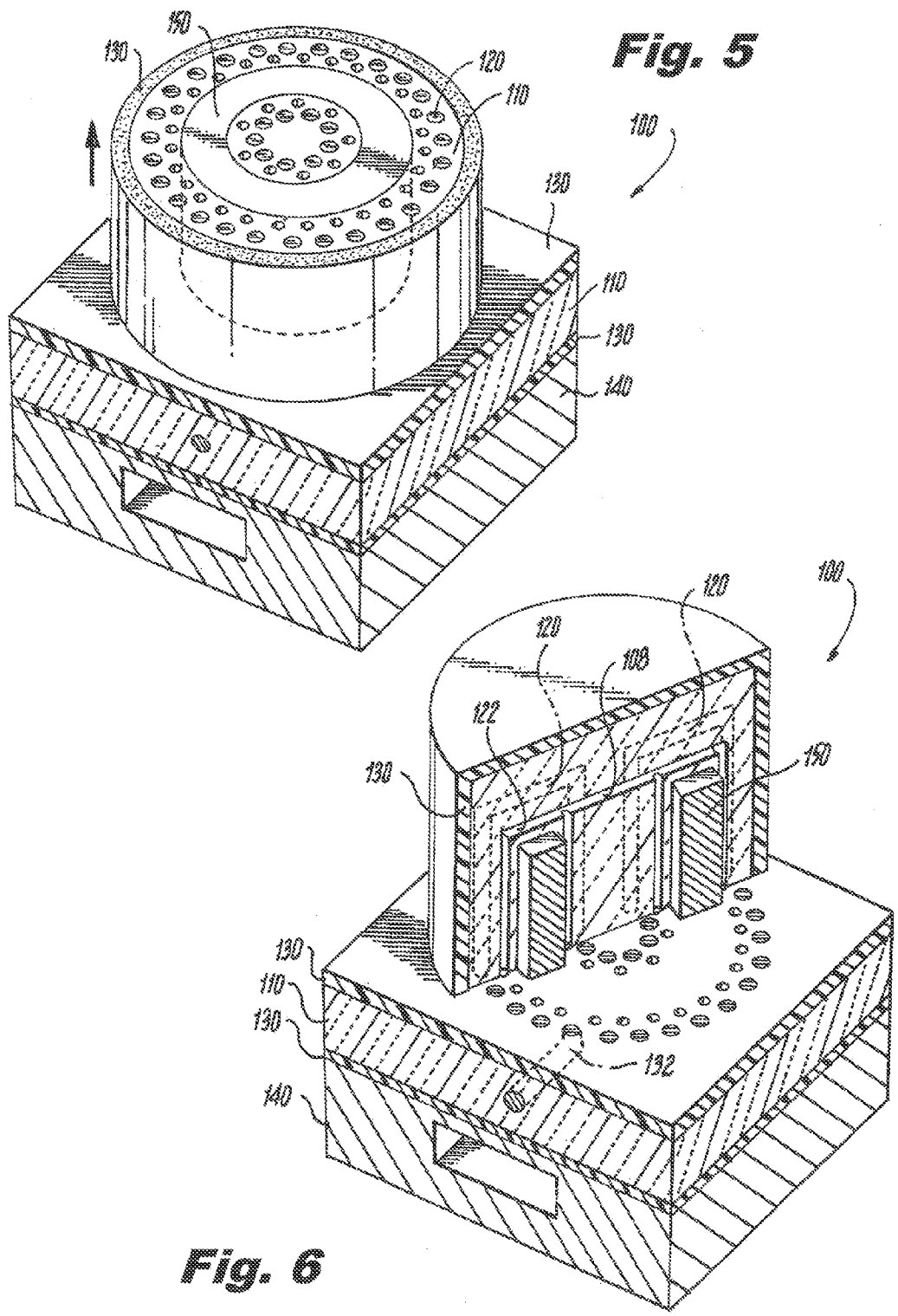

MAGNETIC DEVICES WITH INTEGRAL COOLING CHANNELS

CROSS-REFERENCE TO RELATED APPLICATION

This application claims the benefit of priority to U.S. Provisional Patent Application No. 61/887,052 filed Oct. 4, 2013 which is incorporated by reference herein in its entirety.

BACKGROUND OF THE INVENTION

1. Field of the Invention

The present disclosure relates to power electronic devices, and more particularly to thermal management of magnetics for power electronic devices.

2. Description of Related Art

Vehicle power buses typically power multiple devices with different power requirements from a single power source. The powered devices therefore need to adapt the current received from the power source so that it is suitable for the powered device. Typically, the powered device includes a power conditioner for converting the power, such as by rectifying, inverting, or filtering the current to remove signals or noise, e.g. variation, from received current. Wound magnetics can be used in power conditioners to convert or filter current.

Conventional wound magnetics are passive electrical devices that include a magnetic core and a conductor coil wound about the core. The core generates a persistent magnetic field and current flowing through the windings generates a variable magnetic field. The persistent and variable magnetic fields oppose one another with the persistent magnetic field opposing current flow change in the windings. This opposition removes noise carried in the current by smoothing the change in the current flowing through the conductor. The level of the filtering of the magnetic device is a function of the strength of the persistent magnetic field of the magnetic device core. Magnetic field strength is in turn a function of the core temperature.

One problem with conventional magnetics is that current flowing through the magnetic device windings produces heat due to resistive heating associated with the current flow. The heat can migrate into the magnetic device core, raising its temperature, and change the strength of the field generated by the core. This alters the filtering effect provided by the magnetics, potentially exposing the powered device current with unacceptable levels of variation.

Conventional magnetics have generally been considered satisfactory for their intended purpose. However, there is a need in the art for improved systems and methods for temperature control of magnetics. There also remains a need in the art for such systems and methods that are easy to make and use. The present disclosure provides a solution for these problems.

SUMMARY OF THE INVENTION

A magnetic device includes an electrically insulating body and a conductor coil. The insulating body defines an internal cavity for a magnetic device core and a coolant channel routed about the internal cavity. The conductor coil extends through the insulating body, about the cavity. The insulating body electrically insulates the internal cavity from the coolant channel and separates the coolant channel from the conductor coil.

In certain embodiments, the magnetic device includes an integral housing surrounding the magnetic device body and conductor coil. The housing can define a fluid conduit external to the insulating body for supplying coolant to the cooling channel defined by the insulating body. The housing can further define a cold plate for cooling coolant flowing through the fluid conduit. The insulating body, conductor coil and housing can be integrally formed using an additive manufacturing process.

In accordance with certain embodiments, the insulating body and housing define a coolant inlet fluidly connecting the coolant channel with the fluid conduit for supplying coolant to the magnetic device. The insulating body and housing can also define a coolant outlet fluidly connecting the coolant channel to the fluid conduit. The coolant channel can be a first coolant channel, and the insulating body can define a second coolant channel also extending about the internal cavity. A bridging channel defined by the insulating body can fluidly connect the first and second coolant channels in series. The coolant channel can be a flow structure arranged between the conductor coil and cavity for thermally shielding the cavity from heat generated by current flowing through the conductor coil.

It is contemplated that the fluid conduit can be thermally coupled to a cold plate and the cold plate mechanically coupled to the insulator housing. The cold plate can be integrally formed with the housing and can define therein the fluid conduit for connection with the coolant channel.

A motor controller includes a magnetic device and a housing as described above, wherein the housing and insulating body are integral with one another. The housing encloses the insulating body. A coolant inlet and a coolant outlet are fluidly connected with the coolant channel for removing heat generated by resistive heating of the conductor coil. The insulating body defines a flow structure fluidly connected to the coolant channel and extending about the cavity of the insulating body.

In certain embodiments, the magnetic device includes a magnetic device core with a linear shape disposed within the cavity of the insulating body. The cavity defined by the insulating body can have a toroid shape. It is also contemplated that the magnetic device core can also have a toroid shape, and the insulating body can be conformally disposed about the surface of the magnetic device core.

A method of making a magnetic device includes fabricating a first portion of a magnetic device housing, insulating body, and conductor coil. Fabricating the first portion of the insulating body includes defining a socket in the insulating body. The method also includes seating a magnetic device core in the socket defined by the insulating body and fabricating a second portion of the insulating body such that the socket forms a portion of a cavity occupied by the magnetic device core. Fabricating the first and second portions of the insulating body includes defining a coolant channel within the insulating body.

It is contemplated that forming the first portion of the magnetic device includes integrally forming the first portion using an additive manufacturing process. Forming the second portion of the magnetic device can also include integrally forming the second portion using an additive manufacturing process. It is contemplated that the magnetic device core can be integral with an integrally formed housing, conductor coil, insulating body, and coolant channel flow structure.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein:

FIG. 5 is a cross-sectional perspective view of the magnetic device of FIG. 1, showing the magnetic device core disposed within the cavity during fabrication of a second portion of the magnetic device;

FIG. 6 is a partial cross-sectional perspective view of the magnetic device of FIG. 1 showing the arrangement of the coolant channel, conductor coil, and magnetic device core within the housing and magnetic device body.

DETAILED DESCRIPTION OF THE PREFERRED EMBODIMENTS

Figure 1:
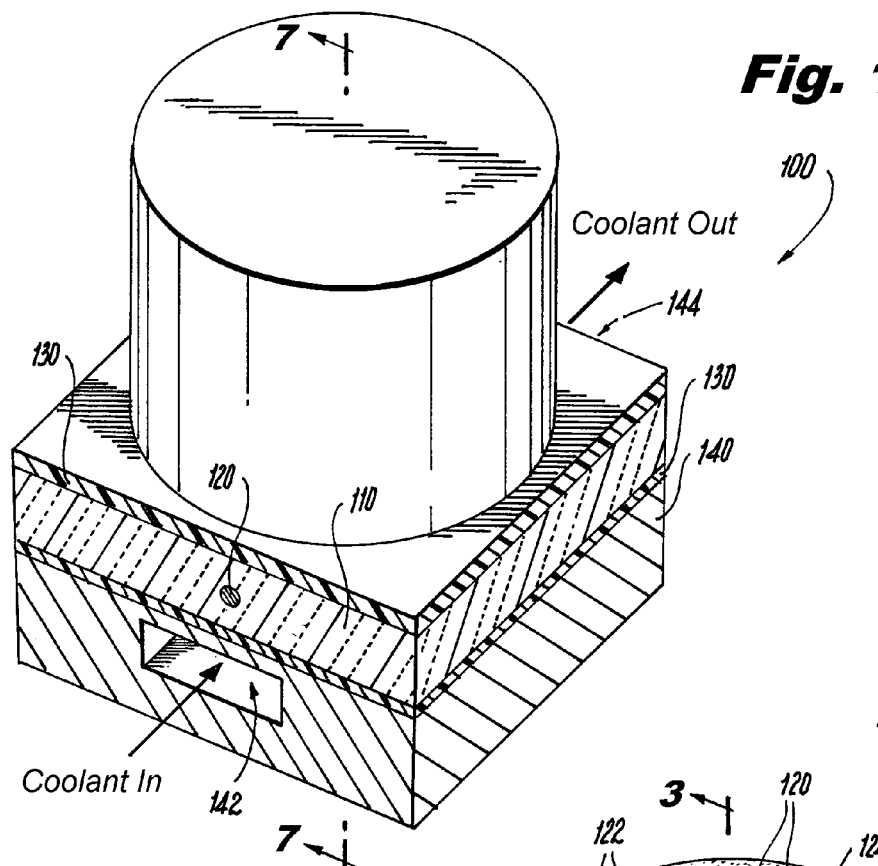
FIG. 1 is a perspective view of an exemplary embodiment of a magnetic device constructed in accordance with the present disclosure, showing the magnetic device housing.

Reference will now be made to the drawings wherein like reference numerals identify similar structural features or aspects of the subject disclosure. For purposes of explanation and illustration, and not limitation, a partial view of an exemplary embodiment of the magnetic device in accordance with the disclosure is shown in FIG. 1 and is designated generally by reference character 100. Other embodiments of magnetic device in accordance with the disclosure, or aspects thereof, are provided in FIGS. 2-7, as will be described. The systems and methods described herein can be used for power conversion devices, such inductors, transformers, and chokes for motor controllers for example.

FIG. 1 shows a motor controller 10 including a magnetic device 100 coupled to a cold plate 140 constructed in accordance with the present disclosure. Magnetic device 100 includes an insulating body 110 and conductor coil 120 substantially disposed, e.g. entirely, with a housing 130. A fluid conduit 142 extends between cold plate 140 and a lower portion of housing 130. Fluid conduit 142 is configured for receiving a coolant flow at a conduit entrance, channeling the flow through magnetic device 100, and more specifically through insulating body 110, for removing heat from magnetic device 100, and dispatching the flow through a conduit exit. Fluid conduit 142 is thermally communicative with cold plate 140, and in the illustrated embodiment is defined within cold plate 140. This allows for efficient heat transfer as there is no intervening material or layers separating cold plate 140 and fluid conduit 142 that could otherwise impede heat transfer between the elements.

Figure 2:
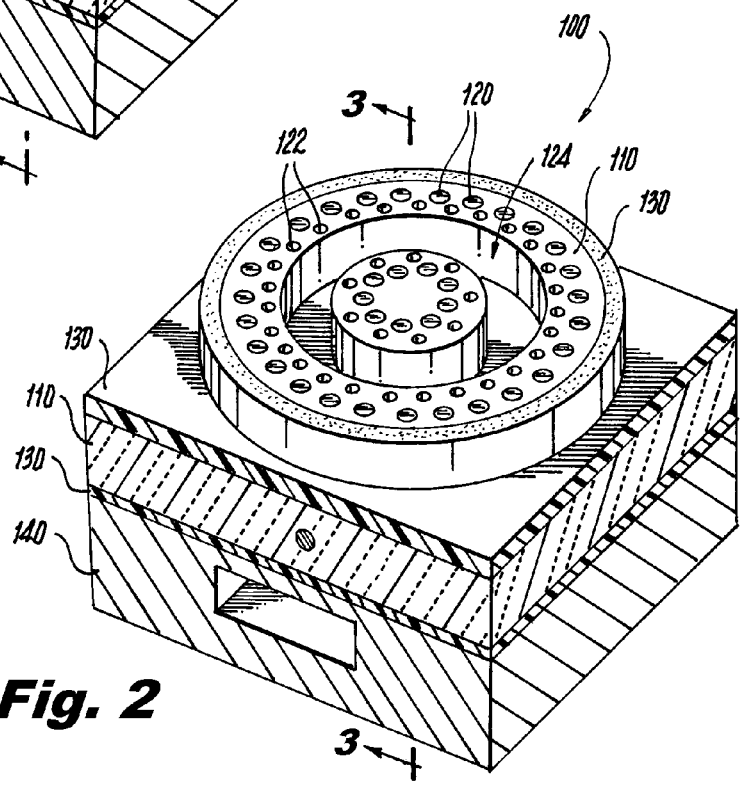
FIG. 2 is a cross-sectional perspective view of the magnetic device of FIG. 1, showing the insulating body, conductor coil, and coolant channel defined by the insulating body.

With reference to FIG. 2, insulating body 110 is disposed with housing 130 and is formed from an electrically insulating material for electrically insulating conductor coil 120. Insulating body 110 defines an internal cavity 124 configured for seating a magnetic device core. Cavity 124 has an inner surface that is conformal and configured for direct contact with the surface of magnetic device core 150 seated in cavity 124. This minimizes the volume occupied by magnetic device 100. In the illustrated embodiment cavity 124 has a toroid shape corresponding to a toroid shaped magnetic device core. As will be appreciated by those skilled in the art, cavity 124 can be suitably shaped to seat a magnetic device core having an appropriate shape as suitable for a given application of magnetic device 100.

Insulating body 110 defines a coolant channel 122. Coolant channel 122 extends through insulating body 110 between a conductor coil 120 formed with insulating body 110. Coolant channel 122 may be a single channel circuitously extending about insulating body 110 or can include a plurality of coolant channels extending from a manifold structure defined within insulating body 110. In the illustrated embodiment, coolant channel 122 includes a plurality channels arranged about a circumference of cavity 124 and defining a flow structure. The flow structure creates a curtain-like cooling effect between cavity 124 and conductor coil 120, operating to thermally isolate cavity 124 from conductor coil 120. This allows a magnetic device core 150 (shown in FIG. 4) to be maintained at a uniform temperature not withstanding heat generated by conductor coil 120. This in turn allows the magnetic device core to have a persistent magnetic field with uniform strength, allowing magnetic device 100 to filter current flowing through conductor coil 120 consistently notwithstanding variation in the current flow.

Figure 3:
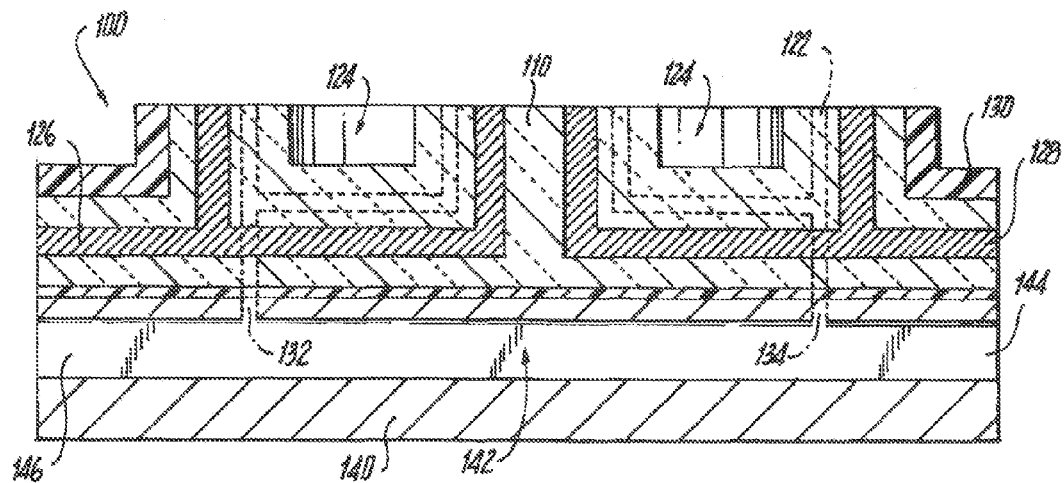
FIG. 3 is cross-sectional side elevation view of the magnetic device of FIG. 2, showing the arrangement of the conductor coil and coolant channel defined by the insulating body.

With reference to FIG. 3, coolant channel 122 fluidly connects to fluid conduit 142 through a coolant inlet 132 and a coolant outlet 134. Coolant inlet 132 and coolant outlet 134 are each defined by both insulating body 110 and housing 130. Insulating body 110 and housing 130 also define electrical connections 126 and 128 to conductor coil 120 for electrically connecting conductor coil 120 to voltage terminals and flowing current through conductor coil 120. Conductor coil 120 passes through cavity 124 at least once, and is formed from an electrically conductive material, such as copper for example.

Both conductor coil 120 and coolant channel 122 extend through or around the cavity 124. In the illustrated embodiment, coolant channel 122 is closer to cavity 124 than corresponding conductor coil 120. This provides a coolant curtain arranged about the conductor. Insulating body 110, conductor coil 120, and housing 130 are integral with one another. Insulating body 110 constructed to conformally surround conductor coil 120 and magnetic device core 150. Housing 130 is constructed so as to conformally envelope insulating body 110. Insulating body 110, conductor coil 120, and housing 130 are integrally formed using an additive manufacturing process. Using an additive manufacturing process enables precisely locating coolant channel 122 between cavity 124 and conductor coil 120. It also allows for provisioning magnetic device 130 with cooling channels without structure independent of insulating body 110. This prevents heat generated by conductor coil 130 from soaking into magnetic device core 150 during continuous operation because coolant channels can be arranged relatively closely to conductor coils. It also allows for cooling without use of an intermediary material that otherwise requires heat to transfer from the insulating body, through a coolant channel wall material, and into the coolant flow. The additive manufacturing process involves the successive addition of metal or thermally conductive polymeric materials to form the housing, conductors, or insulating body using energy from an ultrasonic transducer, laser, electron beam, or cold spray technology. The insulating body could also be deposited using a direct write technology such as, but not limited to, aerosol jetting or injection molding for example. As will be appreciated by those skilled in the art, any suitable process can be used to manufacture a magnetic device in accordance with the present disclosure.

Figure 4:
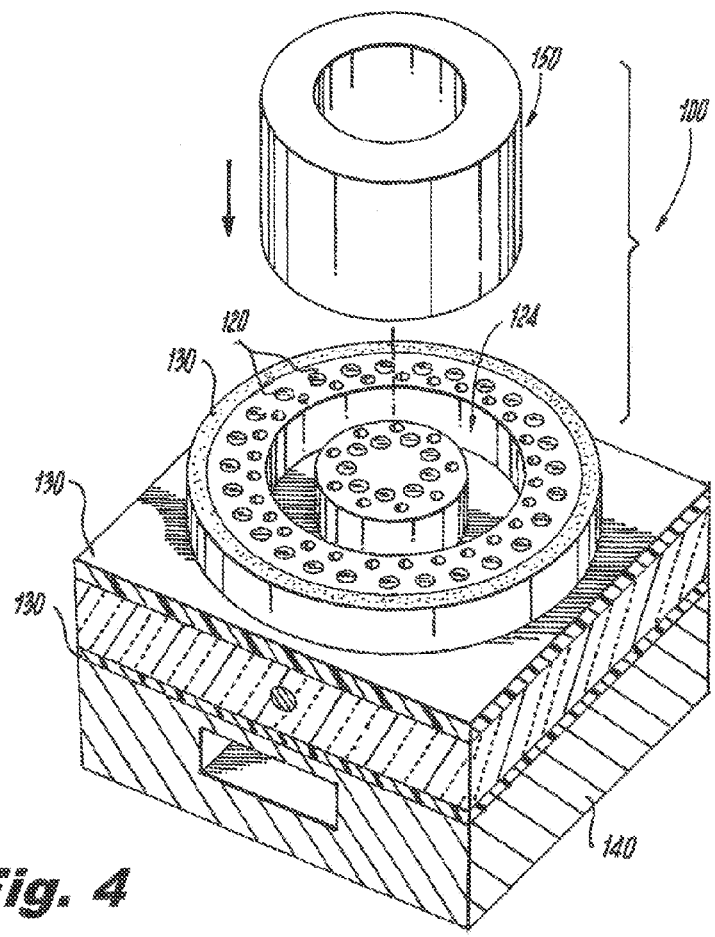
FIG. 4 is a cross-sectional perspective view of the magnetic device of FIG. 1, showing an magnetic device core being received within the cavity defined by the insulating body following fabrication of the a first portion of the magnetic device.

With reference to FIGS. 4 and 5, a "bottom-up" method of fabricating magnetic device, e.g. magnetic device 100, is shown. The method is "bottom-up" in the sense that the magnetic device is constructed over a substrate, e.g. cold plate 140. The method includes integrally forming a first portion (shown in FIG. 5) of the magnetic device using an additive manufacturing process, seating a magnetic device core, e.g. magnetic device core 150, into the magnetic device, and integrally forming a second portion of the magnetic device using the additive manufacturing process. Forming the first portion of the magnetic device can also include forming first portions of an insulating body, e.g. insulating body 110, defining a cavity, coolant channels extending about the cavity, and a conductor coil winding about the cavity. Forming the second portion of the magnetic device can also include forming second portions (shown in FIG. 5) of the insulating body including second portions of the coolant channel, cavity, and conductor coil. Forming an insulating body defining a coolant channel provides a magnetic device wherein there is only a single material, e.g. layer, between the conductor coil and the heat transfer medium. This provides for efficient cooling of the magnetic device as there is no mismatch in thermal conductivities between different materials disposed between the conductor coil and coolant channel. As will be appreciated by those skilled in the art, the cold plate can also be fabricated using an additive manufacturing process. As will also be appreciated, method 200 can also be a "top-down" method wherein the upper portion of housing 130 is constructed as part of the first portion and cold plate 140 is constructed afterwards as part of the second portion.

Figure 7:
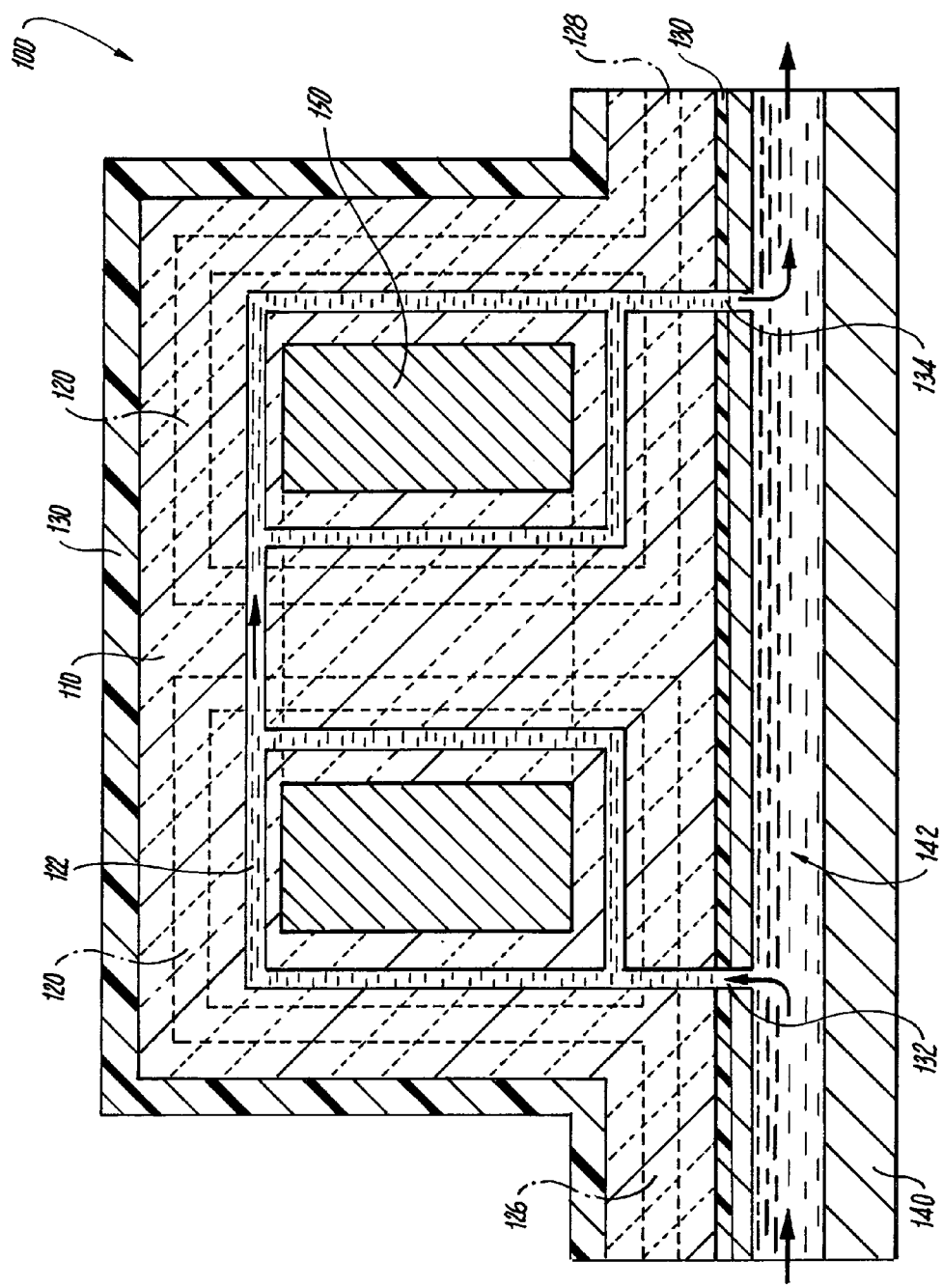
FIG. 7 is cross-sectional side elevation view of the magnetic device of FIG. 1, showing conductor coils and cooling channels about the core.

With reference to FIGS. 6 and 7, magnetic device 100 is shown in perspective partial cross-section and cross-sectional elevation views. Insulating body 110 and housing 130 define a coolant inlet 132 fluidly connecting a coolant channel 122 defined in insulating body 110 and a cold plate 140 with a fluid conduit 142 for supplying coolant to magnetic device 100. Insulating body 110 and housing 130 also define a coolant outlet 134 fluidly connecting coolant channel 122 to fluid conduit 142. Coolant channel 122 includes a first coolant channel and a second coolant channel, each channel extending about a portion of magnetic device core 150 and extending about magnetic device core 150. A bridging channel 108 defined by the insulating body fluidly connects the first and second coolant channels in series. Coolant channel 122 defines a flow structure arranged between the conductor coil and cavity for thermally shielding the cavity from heat generated by current flowing through conductor coil 120. In the illustrated embodiment, the flow structure defines a plurality of relatively small coolant channels positioned between conductor coil 120 and magnetic device core 150.

Conventional magnetics are some of the largest components within certain types of electronic packages. Magnetic device size can be driven by the ability to cool the magnetic device core, particularly in magnetics with core materials that require lower operating temperatures. Using additive manufacturing to fabricate the housing, conductor coil, and cooling channels about the core cavity provides efficient cooling of the core and thermal isolation of the core from the windings. This is additive manufacturing process allows for fabrication of complex coolant channel structures within the magnetic device, allowing for cooling the core while operating the conductor coil at much higher temperatures. Having a coolant channel integrated directly into the cold plate further allows for supplying coolant to the coolant channel structure without the risk of leakage in coolant channel to cold plate interfaces associated with conventionally machined cold plates and coolant channels. This allows for construction of smaller magnetics using higher performance low temperature materials, including but not limited to Metglas® or nanocrystalline cores.

The methods and systems of the present disclosure, as described above and shown in the drawings, provide for magnetics and motor controllers with superior properties including thermal isolation of the magnetic device core from heat resistively generated by the magnetic device conductor coil. While the apparatus and methods of the subject disclosure have been shown and described with reference to preferred embodiments, those skilled in the art will readily appreciate that changes and/or modifications may be made thereto without departing from the spirit and scope of the subject disclosure.

What is claimed is:
1. A magnetic device, comprising:
an electrically insulating body defining:
an internal cavity for a magnetic device core, and
a coolant channel routed about the internal cavity;
a conductor coil extending through the insulating body; and
a cold plate coupled to the electrically insulating body and having a fluid conduit defined therein,
wherein the fluid conduit is fluidly connected to the coolant channel by a coolant inlet extending through the cold plate and the insulating body,
wherein the fluid conduit is fluidly connected to the coolant channel by a coolant outlet extending through the cold plate and the insulating body,
wherein the insulating body electrically insulates the internal cavity from the coolant channel and electrically insulates the coolant channel from the conductor coil.
2. A magnetic device as recited in claim 1, further comprising a housing, wherein the housing is integral with the insulating body and conductor coil.
3. A magnetic device as recited in claim 2, wherein the insulating body and housing define the coolant inlet.
4. A magnetic device as recited in claim 2, wherein the insulating body and housing define the coolant outlet.
5. A magnetic device as recited in claim 1, wherein the insulating body and conductor coil are integrally formed, wherein the cooling channel is integrally defined using energy from an ultrasonic transducer, a laser, an electron beam, or a cold spray technique.
6. A magnetic device as recited in claim 4, wherein the coolant channel is a first coolant channel, wherein the insulating body defines a second coolant channel, and wherein the first and second coolant channels extend about different portions of the internal cavity.
7. A magnetic device as recited in claim 6, wherein the insulating body defines a bridging channel fluidly connecting the first and second coolant channels in series.
8. A magnetic device as recited in claim 1, wherein the coolant channel defines a flow structure disposed between the conductor coil and the internal cavity for thermally shielding the internal cavity from the conductor coil.
9. A magnetic device as recited in claim 1, wherein the cavity is toroid-shaped.

10. A magnetic device as recited in claim 1, further comprising:
a flow structure fluidly connected to the coolant channel, defined by the insulating body, and extending about the cavity of the insulating body;
an integral housing surrounding the magnetic device; and
a coolant inlet and a coolant outlet fluidly connected to the coolant channel for removing heat generated by resistive heating of the conductor coil.

11. A magnetic device as recited in claim 1, further comprising a magnetic device core with a toroid shape, wherein the insulating body is conformally disposed about a surface of the magnetic device core.

12. A magnetic device as recited in claim 1, further including a coolant conduit fluidly connected to the coolant inlet for supplying a coolant flow to the magnetic device and the coolant outlet for removing heat from the magnetic device.

13. A magnetic device as recited in claim 1, wherein the electrically insulating body defining the coolant channel forms a fluid-contacting surface of the coolant channel.

14. A magnetic device, comprising:
an electrically insulating body defining:
an internal cavity with a toroid shape, and
a coolant channel routed about the internal cavity;
a toroid-shaped core seated in the internal cavity;
a conductor coil extending through the insulating body and about the toroid-shaped core;
a cold plate coupled to the electrically insulating body and having a fluid conduit defined therein,
wherein the fluid conduit is fluidly connected to the coolant channel by a coolant inlet extending through the cold plate and the insulating body,
wherein the fluid conduit is fluidly connected to the coolant channel by a coolant outlet extending through the cold plate and the insulating body,
wherein the insulating body electrically insulates the internal cavity from the coolant channel and electrically insulates the coolant channel from the conductor coil, and
wherein coolant channel is disposed between the conductor coil and the core on both radially inner and radially outer sides of the toroid-shaped core.

* * * * *